(12) United States Patent
Takata et al.

(10) Patent No.: US 11,117,755 B2
(45) Date of Patent: Sep. 14, 2021

(54) ELECTRONIC COMPONENT HANDLER, ELECTRONIC COMPONENT TRANSPORT UNIT, AND ELECTRONIC COMPONENT TESTER

(71) Applicant: Seiko Epson Corporation, Tokyo (JP)

(72) Inventors: Fuyumi Takata, Azumino (JP); Noriaki Kotani, Hara (JP)

(73) Assignee: NS Technologies, Inc., Nagano (JP)

( * ) Notice: Subject to any disclaimer, the term of this patent is extended or adjusted under 35 U.S.C. 154(b) by 109 days.

(21) Appl. No.: 16/553,804

(22) Filed: Aug. 28, 2019

(65) Prior Publication Data

US 2020/0071090 A1 Mar. 5, 2020

(30) Foreign Application Priority Data

Aug. 29, 2018 (JP) .............................. JP2018-160038

(51) Int. Cl.
*G01R 1/04* (2006.01)
*B65G 47/91* (2006.01)

(52) U.S. Cl.
CPC .............. *B65G 47/91* (2013.01); *G01R 1/04* (2013.01)

(58) Field of Classification Search
None
See application file for complete search history.

(56) References Cited

U.S. PATENT DOCUMENTS 5,845,385 A * 12/1998 Foerstel ............... H05K 13/021
29/464
2007/0131733 A1 6/2007 Cheng et al.

FOREIGN PATENT DOCUMENTS

| CN | 106290990 A | 1/2017 |
|---|---|---|
| JP | 2002-257510 A | 9/2002 |
| TW | 2007-46942 A | 12/2007 |
| TW | 2017-19510 A | 6/2017 |

* cited by examiner

*Primary Examiner* — Jas A Sanghera
(74) *Attorney, Agent, or Firm* — Yu Gang

(57) ABSTRACT

There is provided an electronic component handler for transporting an electronic component, the handler including a shuttle having a placement surface on which the electronic component is placed and moving from a first position to a second position, and a positioning unit provided in the shuttle and positioning the electronic component by coming into contact with the electronic component placed on the placement surface, in which the positioning unit has a first positioning member and a second positioning member that are driven to move or rotate with respect to the shuttle, when the shuttle is located at the first position, the electronic component is placed on the placement surface, and a distance between the first positioning member and the second positioning member when the shuttle is located at the first position is longer than a distance between the first positioning member and the second positioning member when the shuttle is located at the second position.

10 Claims, 10 Drawing Sheets

ELECTRONIC COMPONENT HANDLER, ELECTRONIC COMPONENT TRANSPORT UNIT, AND ELECTRONIC COMPONENT TESTER

The present application is based on, and claims priority from, JP Application Serial Number 2018-160038, filed Aug. 29, 2018, the disclosure of which is hereby incorporated by reference herein in its entirety.

BACKGROUND

1. Technical Field

The present disclosure relates to an electronic component handler, an electronic component transport unit, and an electronic component tester.

2. Related Art

In the related art, a handler for transporting an IC device has been known (for example, see JP-A-2002-257510). The handler disclosed in JP-A-2002-257510 includes a base substrate having a concave pocket, on which an IC device is placed and of which the shape is constant, that is, unchanged. The IC device placed in the pocket is then transported by a transport mechanism to a socket of a tester and is tested in electrical contact with the socket. At this time, the IC device is positioned by the pocket such that the IC device after being transported is in a correct position with respect to the pocket. In detail, the shape of the pocket is designed such that a gap between a wall of the pocket and the IC device is reduced, and the IC device is positioned by reducing the gap. Further, in general, when the IC device is placed on the pocket, the IC device is placed by a placement arm.

In the handler disclosed in JP-A-2002-257510 as described above, since the gap between the IC device and the pocket is small, high positional accuracy is required when the IC device is placed in the pocket.

SUMMARY

The present disclosure can be realized as the following aspects.

An electronic component handler according to an aspect of the present disclosure is an electronic component handler for transporting an electronic component, the handler including a shuttle having a placement surface on which the electronic component is placed and moving from a first position to a second position, and a positioning unit provided in the shuttle and positioning the electronic component at a predetermined position by coming into contact with the electronic component placed on the placement surface, in which the positioning unit has a first positioning member and a second positioning member that are driven to move or rotate with respect to the shuttle, when the shuttle is located at the first position, the electronic component is placed on the placement surface, and a distance between the first positioning member and the second positioning member when the shuttle is located at the first position is longer than a distance between the first positioning member and the second positioning member when the shuttle is located at the second position.

An electronic component handler according to another aspect of the present disclosure is an electronic component handler for transporting an electronic component, the handler including a shuttle having a placement surface on which the electronic component is placed and moving from a first position to a second position, a positioning unit provided in the shuttle and positioning the electronic component at a predetermined position by coming into contact with the electronic component placed on the placement surface, a transport arm that transports and places the electronic component to and on the placement surface when the shuttle is located at the first position, and a processor, in which the positioning unit has a first positioning member and a second positioning member that are driven to move or rotate with respect to the shuttle, when the shuttle is located at the first position, the electronic component is placed on the placement surface, a distance between the first positioning member and the second positioning member when the shuttle is located at the first position is longer than a distance between the first positioning member and the second positioning member when the shuttle is located at the second position, and the processor performs a control to move the shuttle between the first position and the second position, a control to transport and place the electronic component to and on the placement surface by the transport arm, and a control to move the first positioning member and the second positioning member closer to or farther away from the electronic component.

An electronic component transport unit according to still another aspect of the present disclosure is an electronic component transport unit used when an electronic component is transported, the unit including a shuttle plate having a placement surface on which the electronic component is placed and moving from a first position to a second position, and a positioning unit provided in the shuttle plate and positioning the electronic component at a predetermined position by coming into contact with the electronic component placed on the placement surface, in which the positioning unit has a first positioning member and a second positioning member which are driven to move or rotate with respect to the shuttle plate, when the shuttle plate is located at the first position, the electronic component is placed on the placement surface, and a distance between the first positioning member and the second positioning member when the shuttle plate is located at the first position is longer than a distance between the first positioning member and the second positioning member when the shuttle plate is located at the second position.

An electronic component tester according to still another aspect of the present disclosure is an electronic component tester for testing an electronic component, the tester including a testing unit that tests electrical characteristics of the electronic component, a shuttle having a placement surface on which the electronic component is placed and moving from a first position to a second position, and a positioning unit provided in the shuttle and positioning the electronic component at a predetermined position by coming into contact with the electronic component placed on the placement surface, in which the positioning unit has a first positioning member and a second positioning member which are driven to move or rotate with respect to the shuttle, when the shuttle is located at the first position, the electronic component is placed on the placement surface, and a distance between the first positioning member and the second positioning member when the shuttle is located at the first position is longer than a distance between the first positioning member and the second positioning member when the shuttle is located at the second position.

DESCRIPTION OF EXEMPLARY EMBODIMENTS

Hereinafter, an electronic component handler, an electronic component transport unit, and an electronic component tester according to the present disclosure will be described in detail based on an exemplary embodiment shown in the accompanying drawings.

First Embodiment

Figure 1:
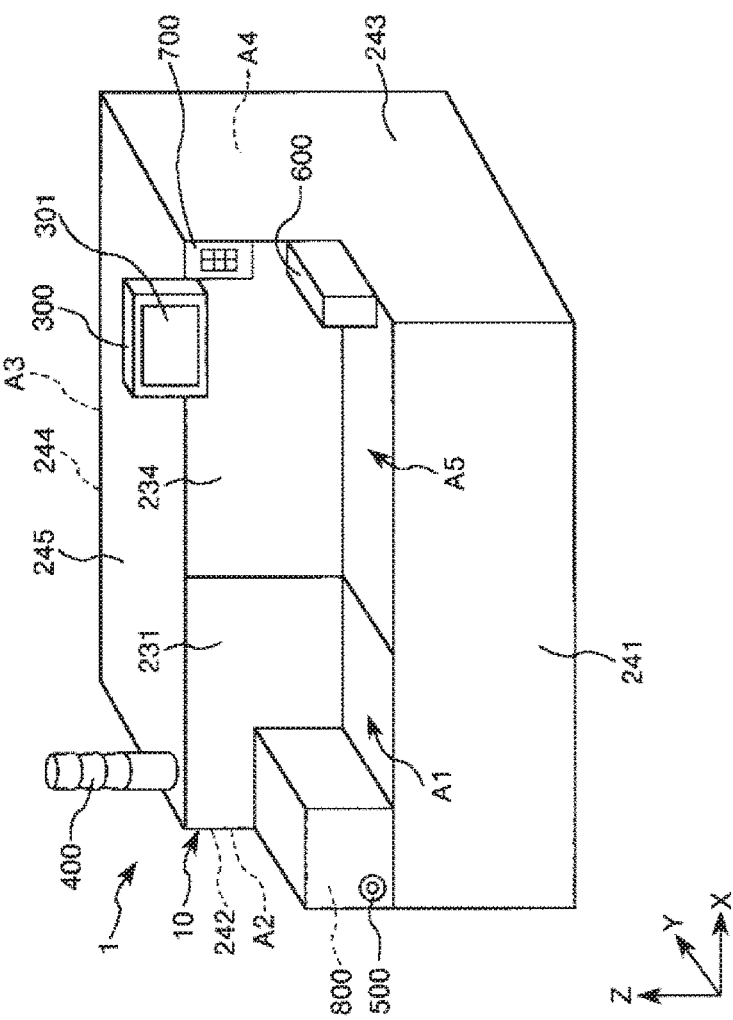
FIG. 1 is a schematic perspective view showing an electronic component tester according to a first embodiment of the present disclosure when viewed from the front side.

Hereinafter, the electronic component handler and the electronic component tester according to a first embodiment of the present disclosure will be described with reference to FIGS. 1 to 5. Hereinafter, for convenience of description, as shown in FIG. 1, three axes that are perpendicular to each other are defined as an X axis (a first axis), a Y axis (a second axis), and a Z axis (a third axis). Further, the XY plane including the X axis and the Y axis is horizontal, and the Z axis is vertical. Further, a direction along the X axis or a straight line that is parallel to the X axis is also referred to as an "X axis direction", a direction along the Y axis or a straight line that is parallel to the Y axis is also referred to as a "Y axis direction", and a direction along the Z axis or a straight line that is parallel to the Z axis is also referred to as a "Z axis direction". Further, for example, movement along the X axis or the straight line that is parallel to the X axis is referred to as "movement in the X axis direction", and arrangement along the X axis or the straight line that is parallel to the X axis is referred to as "arrangement in the X axis direction". Further, a direction of an arrow in each direction is referred to as a "positive direction", and an opposite direction thereto is referred to as a "negative direction". Further, the term "horizontal" used herein is not limited to a perfect horizontal state, and includes a state slightly inclined (for example, less than ±5°) with respect to a horizontal state as long as transport of an electronic component is not impeded. Further, an upper side in FIGS. 1 and 2, that is, the positive direction of the Z axis, is referred to as "upper" or an "upper direction", and a lower side, that is, the negative direction of the Z axis, is referred to as "lower" or a "lower direction". Further, a left side in FIGS. 3 and 4 (similar to FIGS. 6 to 12), that is, the negative direction of the X axis, is referred to as "left" or a "left direction", and a right side in the same drawings, that is, the positive direction of the X axis, is referred to as "right" or a "right direction".

An electronic component handler 10 according to the present disclosure is a handler having an outer appearance shown in FIG. 1. Further, as shown in FIG. 2, an electronic component tester 1 according to the present disclosure includes the electronic component handler 10, and further includes a testing unit 16 that tests an electronic component.

Hereinafter, a configuration of each unit will be described in detail.

Figure 2:
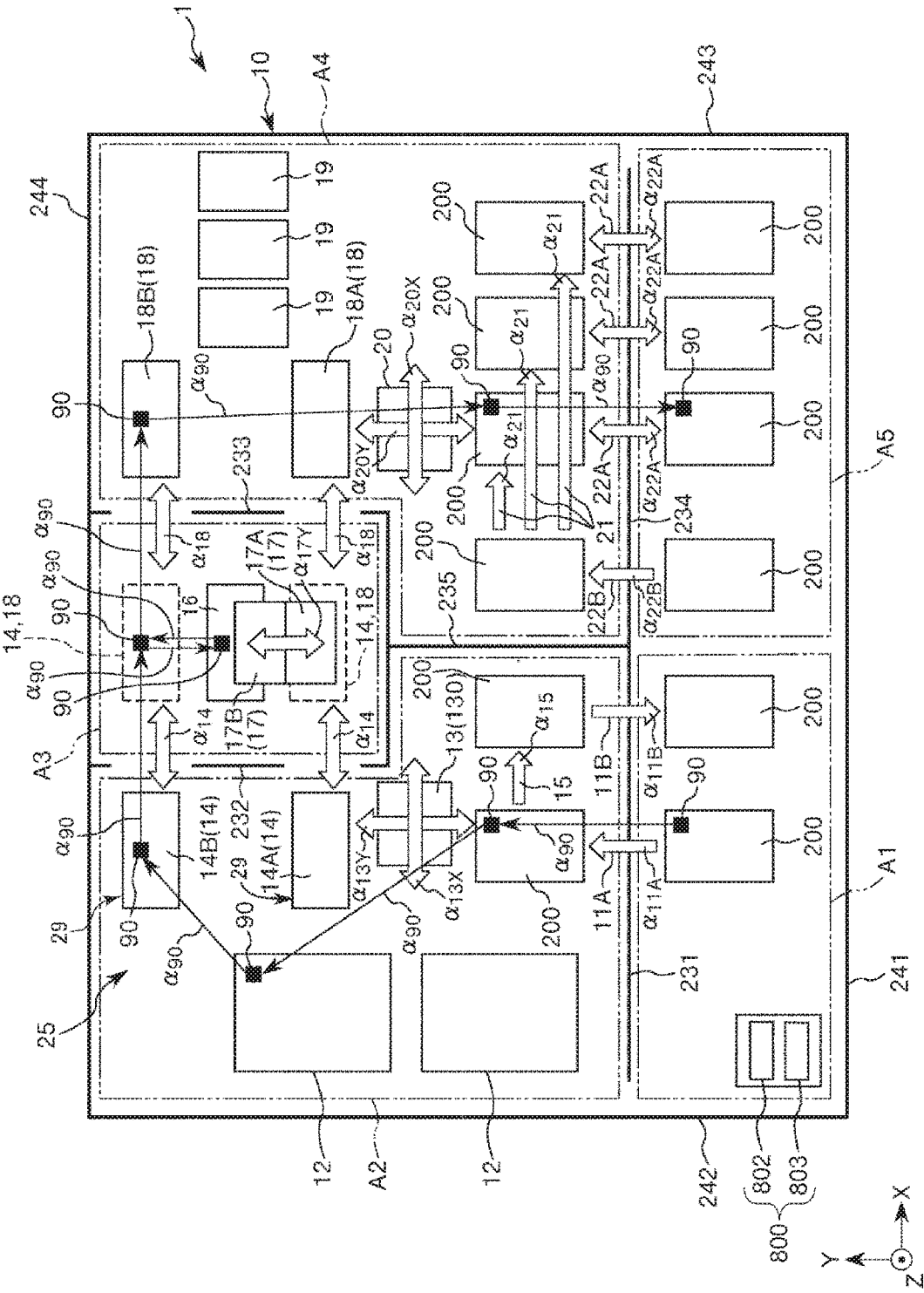
FIG. 2 is a schematic plan view showing an operation state of the electronic component tester shown in FIG. 1.

As shown in FIGS. 1 and 2, the electronic component tester 1 including the electronic component handler 10 is an apparatus that transports an electronic component such as an IC device which is, for example, a ball grid array (BGA) package, and tests and inspects (hereinafter, simply referred to as "test") electrical characteristics of the electronic component in this transport process. Hereinafter, for convenience of description, the IC device is representatively described as the electronic component, which will be referred to as an "IC device 90". In the present embodiment, the IC device 90 has, for example, a flat plate shape and is rectangular in plan view. The shape of the IC device 90 in plan view is not limited to a rectangle, and may be another square such as a square or a circular shape such as a circle and an ellipse.

Examples of the IC device include a "large scale integration (LSI)", a "complementary MOS (CMOS)", a "charge coupled device (CCD)", a "module IC" obtained by packaging IC devices as a plurality of modules, a "crystal device", a "pressure sensor", an "inertial sensor (an acceleration sensor)", a "gyro sensor", a "fingerprint sensor", and the like, in addition to the above-described ones.

The electronic component tester 1 includes a tray supplying area A1, a device supplying area A2, a testing area A3, a device recovering area A4, and a tray removing area A5, and these areas are divided into wall portions, which will be described below. Thus, the IC device 90 is tested in the testing area A3 in the middle while sequentially passing through each area from the tray supplying area A1 to the tray removing area A5 in a direction of an arrow α90. Such an electronic component tester 1 includes the electronic component handler 10 having a transporter 25 that transports the IC device 90 to pass through each area, a testing unit 16 that performs testing inside the testing area A3, and a controller 800. Further, in addition, the electronic component tester 1 includes a monitor 300, a signal lamp 400, and an operation panel 700.

In the electronic component tester 1, a side where the tray supplying area A1 and the tray removing area A5 are arranged, that is, a lower side of FIG. 2, is used as a front surface side, and a side where the testing area A3 is arranged, that is, an upper side of FIG. 2, is used as a rear surface side.

Further, in the electronic component tester 1, a so-called "change kit" exchanged according to types of the IC device 90 is arranged, placed, and used in advance. As the change kit, in the present embodiment, for example, there are a temperature adjusting unit 12, a device supplying unit 14, and a device recovering unit 18, which will be described below. Further, in addition to the above-described change kit, there are also a tray 200 prepared by a user, a recovery tray 19, and additionally, the testing unit 16.

The tray supplying area A1 is a material supplying unit to which the tray 200 is supplied. The tray 200 is a container in which a plurality of untested IC devices 90 are arranged and placed in a matrix. The tray supplying area A1 can also be referred to as a placement area on which the plurality of trays 200 can be stacked and placed. In the present embodiment, a plurality of recesses are arranged in a matrix in each tray 200. The IC device 90 can be accommodated and placed one by one in each recess.

The device supplying area A2 is an area where the plurality of IC devices 90 on the tray 200, transported from the tray supplying area A1, are transported and supplied to the testing area A3. A tray transport mechanism 11A and a tray transport mechanism 11B that transport the trays 200 one by one in a horizontal direction to straddle the tray supplying area A1 and the device supplying area A2 are provided. The tray transport mechanism 11A, which is a part of a transporter 25, can move the tray 200 together with the IC device 90 placed on the corresponding tray 200 in a positive direction of the Y axis, that is, in a direction of an arrow α11A of FIG. 2. Accordingly, the IC device 90 can be stably fed into the device supplying unit A2. Further, the tray transport mechanism 11B can move the empty tray 200 in a negative direction of the Y axis, that is, in a direction of an arrow α11B in FIG. 2. Accordingly, the empty tray 200 can be moved from the device supplying area A2 to the tray supplying area A1.

The temperature adjusting unit 12, a device transport head 13, and a tray transport mechanism 15 are provided in the device supplying area A2. The temperature adjusting unit 12 is called a soak plate, is a "soak plate" written in English, and is a "均温板" written in Chinese. Further, the device supplying unit 14 that is moved to straddle the device supplying area A2 and the testing area A3 is also provided.

In the temperature adjusting unit 12, the plurality of IC devices 90 are placed, and the corresponding placed IC devices 90 can be collectively heated or cooled. Accordingly, the IC device 90 before being tested by the testing unit 16 can be heated or cooled in advance, so that the temperature of the IC device 90 can be adjusted to a temperature suitable for the testing.

Such a temperature adjusting unit 12 is fixed. Accordingly, the temperature of the IC device 90 on the temperature adjusting unit 12 can be stably adjusted. Further, the temperature adjusting unit 12 is grounded.

In a configuration shown in FIG. 2, two temperature adjusting units 12 are arranged and fixed in the Y axis direction. Thus, the IC device 90 on the tray 200 carried in from the tray supplying area A1 by the tray transport mechanism 11A is transported to any one of the temperature adjusting units 12.

The device transport head 13, which is a holder that holds and transports the IC device 90, is movably supported inside the device supplying area A2. The device transport head 13, which is a part of the transporter 25, can be responsible for transporting the IC device 90 between the tray 200 carried in from the tray supplying area A1 and the temperature adjusting unit 12 and transporting the IC device 90 between the temperature adjusting unit 12 and the device supplying unit 14, which will be described below. In FIG. 2, movement of the device transport head 13 in the X axis direction is indicated by an arrow α13X, and movement of the device transport head 13 in the Y axis direction is indicated by an arrow α13Y.

The device supplying unit 14 is referred to as a "supply shuttle plate" or simply a "supply shuttle", on which the temperature-adjusted IC device 90 can be placed and the IC device 90 can be transported to the vicinity of the testing unit 16.

Further, the device supplying unit 14 is supported to be reciprocally movable (movable) between the device supplying area A2 and the testing area A3 along an X axis direction, that is, along a direction of an arrow α14. Accordingly, the device supplying unit 14 can stably transport the IC device 90 from the device supplying area A2 to the vicinity of the testing unit 16 of the testing area A3. Further, after the IC device 90 is removed from the testing area A3 by a device transport head 17, the IC device 90 can return to the device supplying area A2 again.

In a configuration shown in FIG. 2, two device supplying units 14 are arranged in the Y axis direction. The device supplying unit 14 disposed in a negative direction of the Y axis is referred to as a "device supplying unit 14A", and the device supplying unit 14 disposed in a positive direction of the Y axis is referred to as a "device supplying unit 14B". Thus, the IC device 90 on the temperature adjusting unit 12 is transported to the device supplying unit 14A or the device supplying unit 14B in the device supplying area A2. Further, similar to the temperature adjusting unit 12, the device supplying unit 14 is configured to be able to heat or cool the IC device 90 placed on the device supplying unit 14. Accordingly, the IC device 90 of which the temperature is adjusted by the temperature adjusting unit 12 can be transported to the vicinity of the testing unit 16 of the testing area A3 while a temperature adjustment state of the IC device 90 is maintained. Further, similarly to the temperature adjusting unit 12, the device supplying unit 14 is also grounded.

The tray transport mechanism 15 is a mechanism that transports the empty tray 200, from which all the IC devices 90 are removed, in the positive direction of the X axis, that is, in a direction of an arrow α15 in the device supplying area A2. Thus, after the transport, the empty tray 200 returns from the device supplying area A2 to the tray supplying area A1 by the tray transport mechanism 11B.

The testing area A3 is an area for testing the IC device 90. The testing unit 16 for testing the IC device 90 and the device transport head 17 are provided in the testing area A3.

The device transport head 17, which is a part of the transporter 25, is configured to be able to heat or cool the held IC device 90, which is similar to the temperature adjusting unit 12. Accordingly, the IC device 90 of which the temperature adjustment state is maintained can be held, and the IC device 90 can be transported into the testing area A3 while the temperature adjustment state is maintained.

Such a device transport head 17 is supported to be reciprocally movable in the testing area A3 in the Y axis direction and the Z axis direction, and is a part of a mechanism called an "index arm". Accordingly, the device transport head 17 can lift up the IC device 90 from the device supplying unit 14 carried in from the device supplying area A2, and transport and place the IC device 90 to and on the testing unit 16.

In FIG. 2, reciprocation of the device transport head 17 in the Y axis direction is indicated by an arrow α17Y. Further, although the device transport head 17 is supported to be reciprocally movable in the Y axis direction, the present disclosure is not limited thereto. Further, the device transport head 17 may be supported to be reciprocally movable even in the X axis direction. Further, in a configuration shown in FIG. 2, two device transport heads 17 are arranged in the Y axis direction. The device transport head 17 disposed in the negative direction of the Y axis is referred to as a "device transport head 17A", and the device transport head 17 disposed in the positive direction of the Y axis is referred to as a "device transport head 17B". The device transport head 17A can be responsible for transporting the IC device 90 from the device supplying unit 14A to the testing unit 16 in the testing area A3, and the device transport head 17B can be responsible for transporting the IC device 90 from the device supplying unit 14B to the testing unit 16 in the testing area A3.

The testing unit 16 can place the IC device 90 that is an electronic component, and can test electric characteristics of the IC device 90. This testing unit 16 has a recess in which the IC device 90 is accommodated and placed, and a plurality of probe pins are provided at a bottom portion of the recess. Thus, terminals of the IC device 90 and the probe pins are conductively connected to each other, that is, come into contact with each other, so that the IC device 90 can be tested. The testing of the IC device 90 is performed based on a program stored in a testing controller of a tester connected to the testing unit 16.

Similar to the temperature adjusting unit 12, such a testing unit 16 can heat or cool the IC device 90 to adjust a temperature suitable for the testing of the IC device 90.

The device recovering area A4 is an area in which the plurality of IC devices 90 which have been tested in the testing area A3 and have been completely tested are recovered. The recovery tray 19, a device transport head 20, and a tray transport mechanism 21 are provided in the device recovering area A4. Further, the device recovering unit 18 that moves to straddle the testing area A3 and the device recovering area A4 is also provided. Further, the empty tray 200 is also prepared in the device recovering area A4.

While the IC device 90 completely tested by the testing unit 16 is placed on the device recovering unit 18, the device recovering unit 18 moves the IC device 90 to the device recovering area A4. The device recovering unit 18 is called a "recovery shuttle plate" or simply a "recovery shuttle". This device recovering unit 18 is also a part of the transporter 25.

Further, the device recovering unit 18 is supported to be reciprocally movable between the testing area A3 and the device recovering area A4 in the X axis direction, that is, along a direction of an arrow α18. Further, in the configuration shown in FIG. 2, similar to the device supplying unit 14, two device recovering units are arranged in the Y axis direction. The device recovering unit 18 disposed in the negative direction of the Y axis is referred to as a "device recovering unit 18A", and the device recovering unit 18 disposed in the positive direction of the Y axis is referred to as a "device recovering unit 18B". Thus, the IC device 90 on the testing unit 16 is transported to and placed on the device recovering unit 18A or the device recovering unit 18B. The device transport head 17A is responsible for transporting the IC device 90 from the testing unit 16 to the device recovering unit 18A, and the device transport head 17B is responsible for transporting the IC device 90 from the testing unit 16 to the device recovering unit 18B. Further, similar to the temperature adjusting unit 12 and the device supplying unit 14, the device recovering unit 18 is also grounded.

The IC device 90 tested by the testing unit 16 is placed on the recovery tray 19, and the recovery tray 19 is fixed not to move in the device recovering area A4. Accordingly, even in the device recovering area A4 in which a relative large number of various kinds of movable units such as the device transport head 20 are arranged, the tested IC device 90 is stably placed on the recovery tray 19. In the configuration shown in FIG. 2, three recovery trays 19 are arranged along the X axis direction.

Further, three empty trays 200 are arranged along the X axis direction. The IC devices 90 tested by the testing unit 16 are placed even on the empty trays 200. Thus, the IC device 90 on the device recovering unit 18 which has moved to the device recovering area A4 is transported to and placed on any one of the recovery tray 19 and the empty tray 200. Accordingly, the IC device 90 is classified and recovered according to a testing result.

The device transport head 20 is supported to be movable in the device recovering area A4 in the X axis direction and the Y axis direction, and further has a portion that is movable in the Z axis direction. This device transport head 20, which is a part of the transporter 25, can transport the IC device 90 from the device recovering unit 18 to the recovery tray 19 or the empty tray 200. In FIG. 2, movement of the device transport head 20 in the X axis direction is indicated by an arrow α20X, and movement of the device transport head 20 in the Y axis direction is indicated by an arrow α20Y.

The tray transport mechanism 21 is a mechanism that transports the empty tray 200 carried in from the tray removing area A5 in the X axis direction in the device recovering area A4, that is, in a direction of an arrow α21. After this transport, the empty tray 200 is disposed at a position where the IC device 90 is recovered, that is, may be any one of the three empty trays 200.

The tray removing area A5 is a material removing portion where the tray 200 in which the plurality of tested IC devices 90 are arranged is recovered and removed. A large number of the trays 200 may be stacked on the tray removing area A5.

Further, a tray transport mechanism 22A and a tray transport mechanism 22B that transport the tray 200 one by one in the Y axis direction to straddle the device recovering area A4 and the tray removing area A5 are provided. The tray transport mechanism 22A, which is a part of the transporter 25, is a movement portion that causes the tray 200 to reciprocate in the Y axis direction, that is, a direction of an arrow α22A. Accordingly, the tested IC device 90 can be transported from the device recovering area A4 to the tray removing area A5. Further, the tray transport mechanism 22B can move the empty tray 200 for recovering the IC device 90 in the positive direction of the Y axis, that is, a direction of an arrow α22B. Accordingly, the empty tray 200 can move from the tray removing area A5 to the device recovering area A4.

The controller 800 can control an operation of each unit of, for example, the tray transport mechanism 11A, the tray transport mechanism 11B, the temperature adjusting unit 12, the device transport head 13, the device supplying unit 14, the tray transport mechanism 15, the testing unit 16, the device transport head 17, the device recovering unit 18, the device transport head 20, the tray transport mechanism 21, the tray transport mechanism 22A, and the tray transport mechanism 22B. As shown in FIG. 2, in the present embodiment, for example, this controller 800 has at least one processor 802 (at least one processor) and at least one memory 803. The processor 802 can read, for example, a program for determination, a program for an instruction and a command, and the like as various information elements stored in the memory 803, and can perform the determination and the instruction.

Further, the controller 800 may be embedded in the electronic component tester 1 or may be provided in an external device such as an external computer. For example, the external device communicates with the electronic component tester 1 through a cable, wirelessly communicates with the electronic component tester 1, and is connected to the electronic component tester 1 through a network, for example, the Internet.

An operator can set or identify an operation condition and the like of the electronic component tester 1 through a monitor 300. For example, the monitor 300 has a display screen 301 configured with a liquid crystal screen and is disposed an upper portion of a front surface of the electronic component tester 1. As shown in FIG. 1, a mouse stand 600 on which a mouse is placed is provided on a right side of the drawing of the tray removing area A5. This mouse is used when operating a screen displayed on the monitor 300.

Further, an operation panel 700 is disposed on a lower right side of FIG. 1 with respect to the monitor 300. The operation panel 700 instructs the electronic component tester 1 to perform a predetermined operation separately from the monitor 300.

Further, a signal lamp 400 can notify of an operation state and the like of the electronic component tester 1 using a combination of emitting colors. The signal lamp 400 is disposed at an upper portion of the electronic component tester 1. A speaker 500 is embedded in the electronic component tester 1, and the speaker 500 can also notify of the operation state and the like of the electronic component tester 1.

In the electronic component tester 1, a portion between the tray supplying area A1 and the device supplying area A2 is partitioned by a first partition wall 231, a portion between the device supplying area A2 and the testing area A3 is partitioned by a second partition wall 232, a portion between the testing area A3 and the device recovering area A4 is partitioned by a third partition wall 233, and a portion between the device recovering area A4 and the tray removing area A5 is partitioned by a fourth partition wall 234. Further, a portion between the device supplying area A2 and the device recovering area A4 is also partitioned by a fifth partition wall 235.

An outermost unit of the electronic component tester 1 is covered with a cover, and the cover includes, for example, a front cover 241, a side cover 242, a side cover 243, a rear cover 244, and a top cover 245.

As described above, the device supplying unit 14 is supported to be reciprocally movable between the device supplying area A2 and the testing area A3 along the X axis direction. As shown in FIG. 2, the device supplying unit 14 includes the device supplying unit 14A and the device supplying unit 14B. The device supplying unit 14A and the device supplying unit 14B have the same configuration except that arrangement locations thereof are different from each other. Thus, hereinafter, the device supplying unit 14A will be representatively described.

Figure 3:
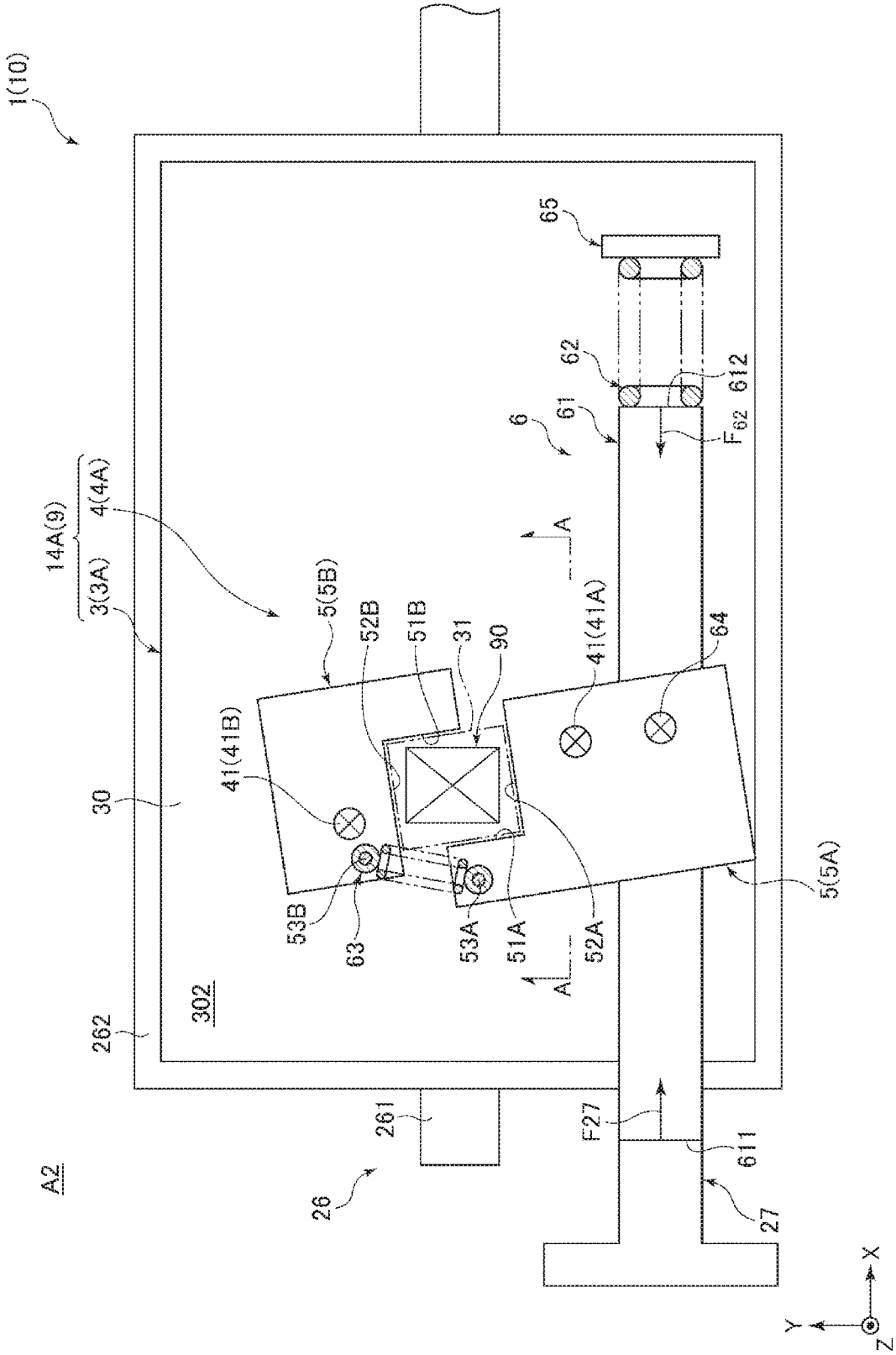
FIG. 3 is a plan view showing an operation state of a device supplying unit of the electronic component tester shown in FIG. 1.
Figure 4:
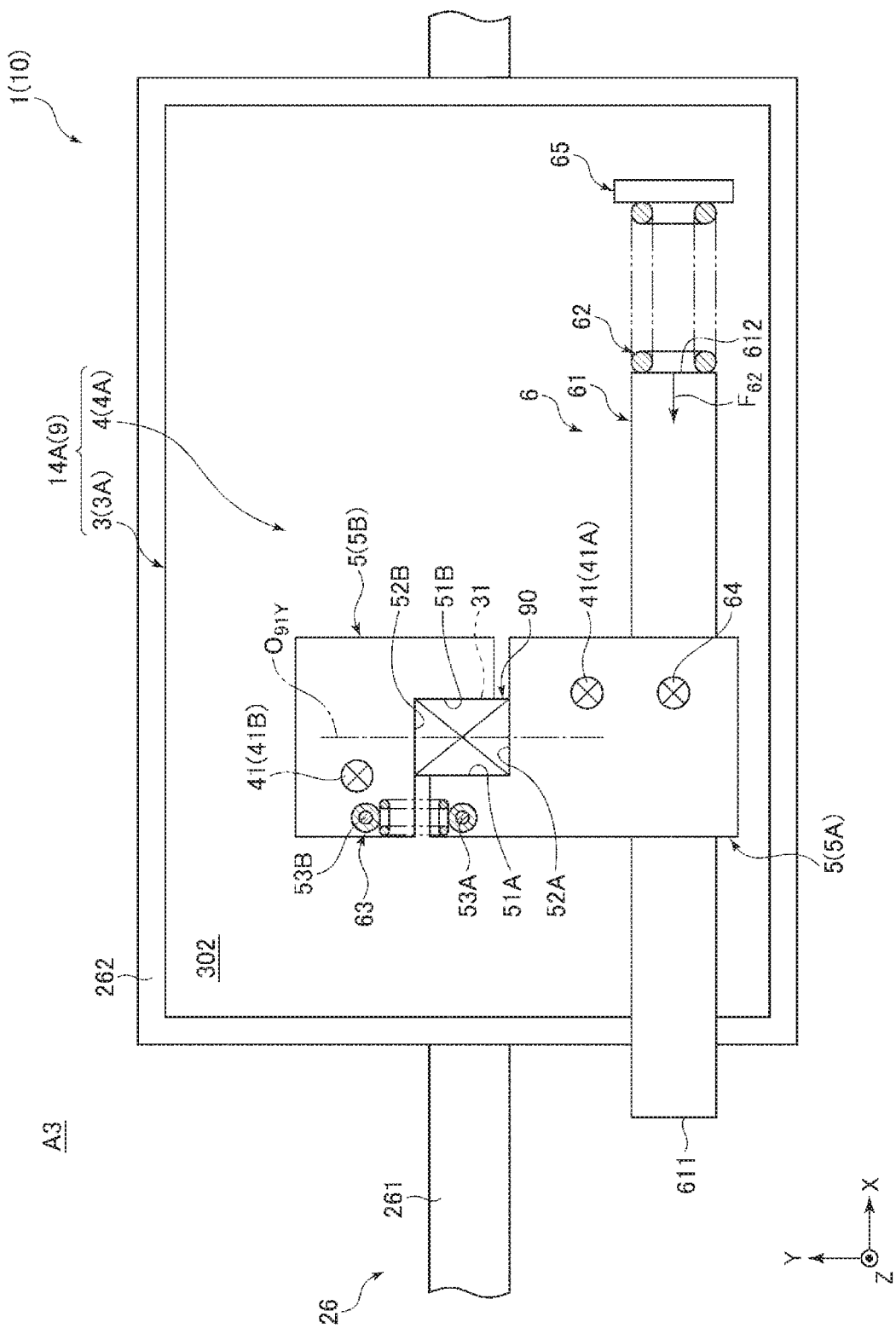
FIG. 4 is a plan view sequentially showing the operation state of the device supplying unit of the electronic component tester shown in FIG. 1.

As shown in FIGS. 3 and 4, the device supplying unit 14A includes a shuttle 3A configured with a shuttle 3 having a placement surface 31 on which the IC device 90 is placed and a positioning unit 4A provided in the shuttle 3 and configured with a positioning unit 4 that positions the IC device 90 placed on the placement surface 31, and is an electronic component transport unit 9 used when the IC device 90 is transported between the tray 200 and the testing unit 16. The electronic component transport unit 9 is the above-described change kit.

Further, the device supplying unit 14A can move between a first position that is a stopping position in the device supplying area A2 and a second position that is a stopping position in the testing area A3 in the X axis direction by a movement support mechanism 26. In this way, the first position and the second position are not the same position. In the device supplying unit 14A, in the first position shown in FIG. 3, the IC device 90, which starts from the tray 200 and passes through the temperature adjusting unit 12, is placed on the placement surface 31 by the device transport head 13. After the device supplying unit 14A is located at the second position shown in FIG. 4, the IC device 90 is lifted up from the placement surface 31 by the device transport head 17A. The lifted-up IC device 90 is tested by the testing unit 16.

The movement support mechanism 26 is disposed below the device supplying unit 14A, and has, for example, a motor, a ball screw connected to the device supplying unit 14A while being connected to the motor, and a linear guide connected to the device supplying unit 14A. A guide rail 261 having a linear guide is shown in FIGS. 3 and 4. Further, a base substrate 262 on which the device supplying unit 14A is disposed and placed is fixed to a slider sliding on the guide rail 261. The movement support mechanism 26 having such a configuration can cause the device supplying unit 14A to smoothly reciprocate in the X axis direction, that is, between the first position and the second position.

The shuttle 3 has a plate shape, and is configured with a shuttle plate 30 having the placement surface 31 set on an upper surface 302 thereof. Although the setting number of the placement surface 31 set on the upper surface 302 is one in the configuration shown in FIGS. 3 and 4, the present disclosure is not limited thereto. For example, the setting number may be plural. When the setting number of the placement surface 31 is plural, the setting number of the placement surface 31 along the X axis direction and the setting number of the placement surface 31 along the Y axis direction can be arbitrary. Further, the placement surface 31 is not limited to be located on the same plane as the upper surface 302. For example, when a recess in which the IC device 90 is accommodated and placed is formed in the upper surface 302, the placement surface 31 may be configured on a bottom surface of the recess.

The shuttle 3 can move between the first position and the second position by the positioning unit 4 and the movement support mechanism 26, as described above.

The positioning unit 4 has a plurality of positioning members 5 that position the IC device 90 on the placement surface 31 and driving units 6 that rotate the positioning members 5, respectively.

As shown in FIGS. 3 and 4, in the present embodiment, the positioning unit 4 has two positioning members 5 configured with plate pieces. In the two positioning members 5, the positioning member 5 disposed along the Y axis direction and located in the negative direction of the Y axis is referred to as a "first positioning member 5A", and the positioning member 5 located in the positive direction of the Y axis is referred to as a "second positioning member 5B". Notch portions facing the placement surface 31 are formed in the first positioning member 5A and the second positioning member 5B, respectively. Thus, a first surface 51A and a second surface 52A, which are perpendicular to each other, are formed on an inner surface of the notch portion of the first positioning member 5A. A first surface 51B and a second surface 52B, which are perpendicular to each other, are formed on an inner surface of the notch portion of the second positioning member 5B. The number of the positioning members 5 of the positioning unit 4 is not limited to two, and may be, for example, three or more.

A constituent material of each positioning member is not particularly limited, and for example, various resin materials or various metal materials can be used. When the positioning member 5 is made of a resin material, it is preferable that polyphenylene sulfide (PPS) resin is used as the resin material.

Figure 5:
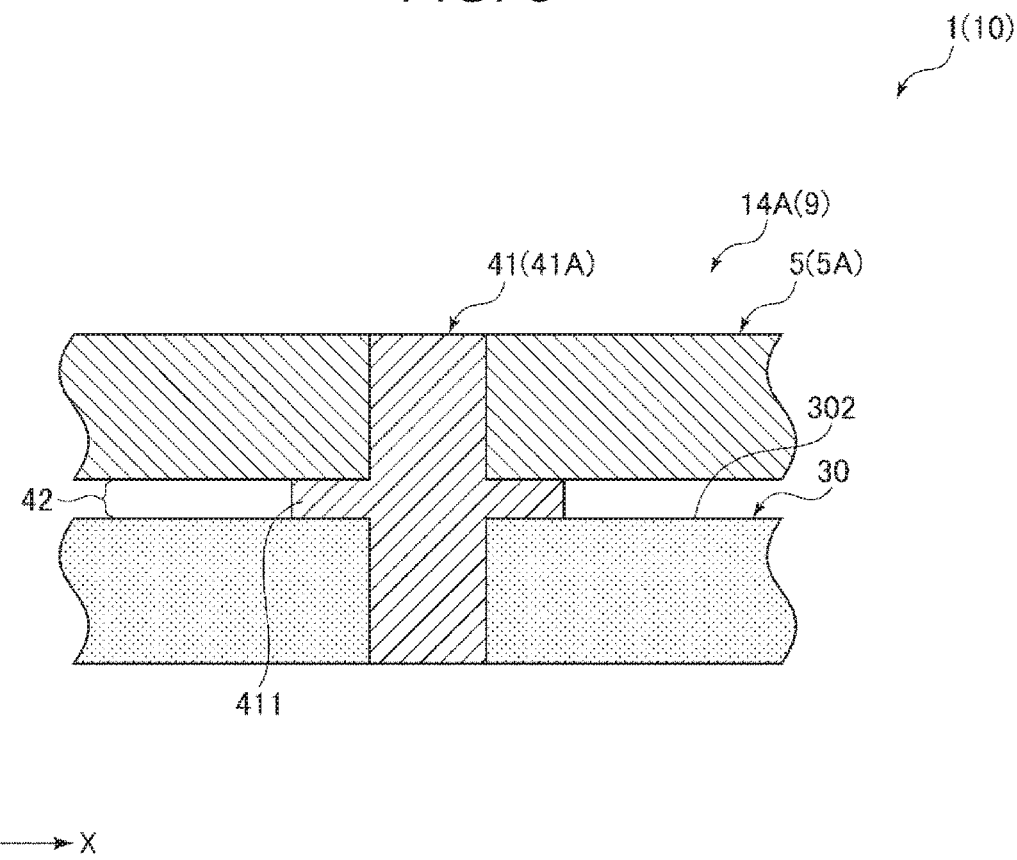
FIG. 5 is a cross-sectional view taken along line A-A of FIG. 3.

Further, the positioning member 5 is supported on the shuttle plate 30 to be rotatable about a rotary shaft 41. As shown in FIG. 5, the rotary shaft 41 is a cylindrical shaft member having a lower end fixed to the shuttle plate 30 and an upper end rotatably supporting the positioning member 5. A flange portion 411, the outer diameter of which is enlarged, is formed in the middle of the rotary shaft 41 in the Z axis direction. Accordingly, a gap 42 is formed between the positioning member 5 and the shuttle plate 30. The gap 42 prevents friction between the positioning member 5 and the shuttle plate 30 from being generated when the positioning member is rotated, so that the positioning member 5 can be smoothly rotated. In addition, wear of the positioning member 5 and the shuttle plate 30 is prevented.

The flange portion 411 may be omitted from the rotary shaft 41. In this case, it is preferable that at least a surface of both or one of the positioning member 5 and the shuttle plate 30 be made of a material having low friction.

Further, hereinafter, the rotary shaft 41 that rotatably supports the first positioning member 5A is referred to as a "rotary shaft 41A", and the rotary shaft 41 that rotatably supports the second positioning member 5B is referred to as a "rotary shaft 41B".

In such a positioning unit 4, the first positioning member 5A and the second positioning member 5B are rotatably supported. Accordingly, as shown in FIG. 3, the first positioning member 5A and the second positioning member 5B are spaced apart from each other and become an open state, when the shuttle 3 is located at the first position. In the open state, the IC device 90 can be placed on the placement surface 31. Further, as shown in FIG. 4, the first positioning member 5A and the second positioning member 5B come into contact with each other and become a close state, when the shuttle 3 is located at the second position. In the close state, the IC device 90 can be positioned on the placement surface 31.

In the present embodiment, the first positioning member 5A and the second positioning member 5B become the close state while moving from the first position to the second position. However, the present disclosure is not limited thereto. The first positioning member 5A and the second positioning member 5B become the close state when reaching the second position.

As shown in FIG. 4, the first positioning member 5A has a first surface 51A that comes into contact with the IC device 90 (an electronic component) in the negative direction of the X axis to position the IC device 90 in the X axis direction (a first axis direction) and a second surface 52A that comes into contact with a portion of the IC device 90, which is different from the first surface 51A, in the negative direction of the Y axis to the position the IC device 90 in the Y axis direction (a second axis direction) intersecting the X axis direction.

Further, the second positioning member 5B has a first surface 51B that comes into contact with the IC device (an electronic component) in the positive direction of the X axis to position the IC device 90 in the X axis direction and a second surface 52B that comes into contact with a portion of the IC device 90, which is different from the first surface 51B, in the positive direction of the Y axis to the position the IC device 90 in the Y axis direction intersecting the X axis direction.

Thus, while the IC device 90 is held between the first surface 51A and the first surface 51B along the X axis direction, the IC device 90 can be held between the second surface 52A and the second surface 52B along the Y axis direction. Accordingly, the posture of the IC device 90 is corrected, that is, the IC device 90 is accurately positioned. In the testing area A3, the device transport head 17A can stably hold the IC device in a positioned state, and can transport the IC device 90 to the testing unit 16 as it is. The testing unit 16 is provided with a guide pin as a reference member at a position that is a reference with respect to a socket, and the device supplying unit 14A is provided with the same guide pin.

The device transport head 17A is provided with a holding member (for example, a suction nozzle) that holds the IC device 90 and is provided with a guide hole through which the guide pin is inserted.

A distance between the guide pin provided in the device supplying unit 14A and a predetermined area where the IC device 90 is positioned is determined to coincide with a distance between a guide pin and a socket provided in the testing unit 16. Further, a posture of the predetermined area where the IC device 90 is positioned with respect to the guide pin provided in the device supplying unit 14A is determined to coincide with a posture of the socket with respect to the guide pin provided in the testing unit 16.

When the IC device 90 is held from the device supplying unit 14A, the guide pin of the device supplying unit 14A is inserted through the guide hole of the device transport head 17A. Accordingly, the holding member of the device transport head 17A is guided to a predetermined area in a predetermined posture. Thereafter, when the IC device 90 is transported to the testing unit 16, the guide pin of the testing unit 16 is inserted through the guide hole of the device transport head 17A. Accordingly, the holding member of the device transport head 17A and the IC device 90 held in the holding member are guided to be in a correct position and a correct posture with respect to the socket.

The first surface 51A and the first surface 51B are spaced apart from each other more widely in the state shown in FIG. 3 than in the state shown in FIG. 4. Similarly, the second surface 52A and the second surface 52B are also spaced apart from each other more widely in the state shown in FIG. 3 than in the state shown in FIG. 4.

Further, as shown in FIG. 4, the rotary shaft 41A and the rotary shaft 41B are arranged to be misaligned from a central axis O91Y of the IC device 90. In the present embodiment, the rotary shaft 41A is disposed in the positive direction of the X axis with respect to the central axis O91Y, and the rotary shaft 41B is disposed in the negative direction of the X axis with respect to the central axis O91Y. The central axis O91Y is a central axis that is parallel to the Y axis direction and passes through the center of the IC device in the positioned state.

Further, in the positioning unit 4, the first surface 51A and the first surface 51B may be referred to as a "first regulation unit" that regulates a position of the IC device 90 in the X axis direction. Meanwhile, the second surface 52A and the second surface 52B may be referred to as a "second regulation unit" that regulates a position of the IC device 90 in the Y axis direction.

As described above, in the present embodiment, the positioning unit 4 has two positioning members 5, that is, the first positioning member 5A and the second positioning member 5B. Thus, the shuttle 3 is provided with a rotary shaft 41 about which the first positioning member 5A and the second positioning member 5B rotate and a driving unit 6 which rotates the first positioning member 5A and the second positioning member 5B about the rotary shaft 41.

In detail, as shown in FIGS. 3 and 4, the positioning unit 4 has the driving unit 6 that rotates each positioning member 5. This driving unit 6 has three members.

The first member 61 is provided with a connection unit 64 connected to the first positioning member 5A to rotate the first positioning member 5A about the rotary shaft 41, and receives a pressing force to move in a direction of the pressing force. This first member 61, which is a rod-like member disposed in parallel to the X axis, is supported to be movable along the X axis direction. The first member 61 is rotatably connected to one positioning member 5 among the two positioning members 5, that is, in the present embodiment, the first positioning member 5A through the connection unit 64, in the middle of the longitudinal direction. Further, as shown in FIG. 3, in a state in which the device supplying unit 14A is located at the first position, a left end 611 of the first member 61 comes into contact with a stopper 27 provided inside the device supplying area A2. Accordingly, the first member 61 can receive a pressing force F27 directed from the stopper 27 in the positive direction of the X axis to move in a direction of the pressing force F27.

The second member 62 is disposed on a right end 612 side of the first member 61. The second member 62 is a coil spring that urges the first member 61 in an opposite direction to the direction of the pressing force F27, that is, along the negative direction of the X axis. The second member 62 is in a compressed state between a right end 612 of the first member 61 and a spring seat 65 fixed onto the shuttle plate 30. Accordingly, an urging force F62 of the second member 62 can be applied to the first member 61.

A third member 63 has one end connected to the first positioning member 5A and the other end connected to the second positioning member 5B, and is elastically deformed. The third member 63 is an elastic member that connects a portion 53A located in the negative direction of the X axis from the first surface 51A of the first positioning member 5A and a portion 53B located in the negative direction of the X axis from the rotary shaft 41B of the second positioning member 5B. In the present embodiment, the third member 63 is a coil spring that urges the first positioning member 5A and the second positioning member 5B in a direction in which the first positioning member 5A and the second positioning member 5B are spaced apart from each other.

As shown in FIG. 3, in a state in which the device supplying unit 14A is located at the first position in the device supplying area A2, the first member 61 receives the pressing force F27 from the stopper 27. Accordingly, the first member 61 moves in the positive direction of the X axis against the urging force F62 of the second member 62. Thus, with the movement of the first member 61, the first positioning member 5A can rotate about the rotary shaft 41A in a counterclockwise direction of FIG. 3, and the second positioning member 5B can also rotate about the rotary shaft 41B in a counterclockwise direction of FIG. 3. Accordingly, the first surface 51A of the first positioning member 5A and the first surface 51B of the second positioning member 5B are spaced apart from each other, and the second surface 52A of the first positioning member 5A and the second surface 52B of the second positioning member 5B are spaced apart from each other. In this way, in a state in which the first member 61 receives the pressing force F27 against the urging force F62 of the second member 62, when moving in a direction of the pressing force F27, the first positioning member 5A and the second positioning member 5B can be separated from each other.

In the device supplying unit 14A, an area surrounded by the first surface 51A, the first surface 51B, the second surface 52A, and the second surface 52B is the placement surface 31 on which the IC device 90 is placed. In a state in which the device supplying unit 14A is located at the first position, the placement surface 31 is secured wider by a distance by which the first positioning member 5A and the second positioning member 5B are spaced apart from each other. The width is not particularly limited. For example, it is preferable that the width is 1.2 time or more and 2 times or less the size of the IC device 90 in a plan view, and it is more preferable that the width is 1.2 times or more and 1.5 times or less the size of the IC device 90. Accordingly, the IC device 90 has a sufficient margin between the first surface 51A, the first surface 51B, the second surface 52A, and the second surface 52B, that is, is placed on the placement surface 31 while being spaced apart from the first surface 51A, the first surface 51B, the second surface 52A, and the second surface 52B as far as possible.

When the IC device 90 is placed on the placement surface 31, in a plan view, it is preferable that the placement is performed such that the center of the IC device 90 substantially coincides with the center of the placement surface 31. However, even when the centers are misaligned from each other, the IC device 90 has only to be placed on the widely-secured placement surface 31.

Further, in recent years, the IC device 90 has been miniaturized. As the IC device 90 becomes smaller, accurate placement on the placement surface 31 tends to be difficult. Thus, in the device supplying unit 14A, when the IC device 90 is placed on the placement surface 31, the size of the placement surface 31 can be expanded once. Accordingly, the IC device 90 can be accurately placed on the placement surface 31.

After the IC device 90 is placed on the placement surface 31, when moving from the state shown in FIG. 3 in the positive direction of the X axis, that is, toward the testing area A3, the device supplying unit 14A is in the state shown in FIG. 4.

In the state shown in FIG. 4, the device supplying unit 14A is located at the second position in the testing area A3. Further, since the first member 61 is spaced apart from the stopper 27, the pressing force F27 is released. Accordingly, the first member 61 can move in the negative direction of the X axis by the urging force F62 of the second member 62. Thus, with the movement of the first member 61, the first positioning member 5A can rotate about the rotary shaft 41A in a clockwise direction of FIG. 4, and the second positioning member 5B can also rotate about the rotary shaft 41B in a counterclockwise direction of FIG. 4. Accordingly, the first surface 51A of the first positioning member 5A and the first surface 51B of the second positioning member 5B approach each other, and the second surface 52A of the first positioning member 5A and the second surface 52B of the second positioning member 5B approach each other. In this way, when the pressing force F27 is released, and thus the first member 61 moves in an opposite direction to the direction of the pressing force F27, that is, in the negative direction of the X axis, by the urging force F62 of the second member 62, the first positioning member 5A and the second positioning member 5B can approach each other. Accordingly, as described above, the first surface 51A comes into contact with the IC device while approaching the IC device 90 in the negative direction of the X axis, and the first surface 51B comes into contact with the IC device 90 while approaching the IC device 90 in the positive direction of the X axis. Thus, the IC device 90 is positioned in the X axis direction. Further, the second surface 52A comes into contact with the IC device 90 while approaching the IC device 90 in the negative direction of the Y axis, and the second surface 52B comes into contact with the IC device 90 while approaching the IC device 90 in the positive direction of the Y axis. Thus, the IC device 90 is positioned in the Y axis direction.

Further, the driving unit 6 is configured to collectively rotate the first positioning member 5A and the second positioning member 5B by movement of one first member 61. In contrast, for example, when the first positioning member 5A and the second positioning member 5B are configured to rotate independently, it tends to be difficult to adjust a timing at which the positioning member 5 rotates and a rotational angle of the positioning member 5. Thus, a configuration in which the positioning member 5 collectively rotates may be a preferable configuration in which the rotational timing and the rotational angle of the positioning member 5 can be relatively easily adjusted.

To increase the size of the placement surface 31 surrounded by the positioning member 5 once, the positioning member 5 may be moved by the driving unit 6 or the positioning member 5 may be moved other than rotation. Further, the driving unit 6 may be a motor, a cylinder, or the like.

Further, as a distance between the rotary shaft 41A and the connection unit 64 becomes shorter, the larger rotational angles of the first positioning member 5A and the second positioning member 5B per unit movement amount of the first member 61 can be secured. In contrast, as the distance between the rotary shaft 41A and the connection unit 64 becomes longer, influence of the rotational angle of the first positioning member 5A due to an error of an arrangement position of the rotary shaft 41A can be suppressed.

As above, the electronic component handler 10 according to the present disclosure is an electronic component handler that transports the IC device 90 between the tray 200 (a container) and the testing unit 16 when the tray 200 as the container on which the plurality of IC devices 90 (electronic components) are placed and the testing unit 16 that tests electric characteristics of the IC device 90 are arranged.

Thus, the electronic component handler 10 includes the shuttle 3 having the placement surface 31 on which the IC device 90 is placed and moving from the first position to the second position and the positioning unit 4 provided in the shuttle 3 and positioning the IC device 90 at a predetermined position by coming into contact with the IC device 90 placed on the placement surface 31.

The positioning unit 4 includes the first positioning member 5A and the second positioning member 5B which are driven to move or rotate with respect to the shuttle 3. Thus, when the shuttle 3 is located at the first position, the IC device 90 is placed on the placement surface 31 from the tray 200. A distance between the first positioning member 5A and the second positioning member 5B when the shuttle 3 is located at the first position is longer than a distance between the first positioning member 5A and the second positioning member 5B when the shuttle 3 is located at the second position.

Further, the electronic component handler 10 according to the present disclosure includes the shuttle 3A having the placement surface 31 on which the IC device 90 is placed and moving from the first position to the second position, the positioning unit 4A provided in the shuttle 3A and positioning the IC device 90 at a predetermined position by coming into contact with the IC device 90 placed on the placement surface 31, a transport arm 130 having the device transport head 13 which transports and places the IC device 90 to and on the placement surface 31 when the shuttle 3A is located at the first position, and a processor 802.

The positioning unit 4A has the first positioning member 5A and the second positioning member 5B which are driven to move or rotate with respect to the shuttle 3A. When the shuttle 3A is located at the first position, the IC device 90 is placed on the placement surface 31 from the tray 200. The distance between the first positioning member 5A and the second positioning member 5B when the shuttle 3A is located at the first position is longer than the distance between the first positioning member 5A and the second positioning member 5B when the shuttle 3A is located at the second position.

The processor 802 can control to move the shuttle 3A between the first position and the second position, can control the device transport head 13 of the transport arm 130 to transport and place the IC device 90 to and on the placement surface 31, and can control to move the first positioning member 5A and the second positioning member 5B closer to or further away from the IC device 90.

Further, the electronic component transport unit according to the present disclosure is an electronic component transport unit that is used when the IC device 90 is transported between the tray 200 and the testing unit 16, when the tray 200 on which the plurality of IC devices 90 are placed and the testing unit 16 that tests electrical characteristics of the IC device 90 are arranged.

Thus, the electronic component transport unit 9 includes the shuttle plate 30 having the placement surface 31 on which the IC device 90 is placed and moving from the first position to the second position and the positioning unit 4 provided in the shuttle plate 30 and positioning the IC device 90 at a predetermined position by coming into contact with the IC device 90 placed on the placement surface 31.

As described above, the positioning unit 4 includes the first positioning member 5A and the second positioning member 5B which are driven to move or rotate with respect to the shuttle 3. Thus, when the shuttle 3 is located at the first position, the IC device 90 is placed on the placement surface 31 from the tray 200. A distance between the first positioning member 5A and the second positioning member 5B when the shuttle 3 is located at the first position is longer than a distance between the first positioning member 5A and the second positioning member 5B when the shuttle 3 is located at the second position.

According to the present disclosure, as described above, in the device supplying unit 14A, when the IC device 90 is placed on the placement surface 31, the positioning members 5 can be spaced apart from each other. Thus, the size of the placement surface 31 surrounded by these positioning members 5 can be increased once. Accordingly, the IC device 90 can be accurately placed on the placement surface 31 of which the size is increased. Further, after the IC device 90 is placed, the positioning members 5 can approach each other to come into contact with a plurality of points of the IC device 90. Accordingly, the IC device 90 is accurately positioned.

Further, the electronic component tester 1 includes the electronic component handler 10, and further includes the testing unit 16 that tests the IC device 90. That is, the electronic component tester 1 is an electronic component tester that tests the IC device 90 transported to the tray 200 on which the IC device is placed. The electronic component tester 1 includes the testing unit 16 that tests electrical characteristics of the IC device 90 transported from the tray 200, the shuttle 3 having the placement surface 31 on which the IC device 90 is placed and moving from the first position to the second position, and the positioning unit 4 provided in the shuttle 3 and positioning the IC device at a predetermined position by coming into contact with the IC device 90 placed on the placement surface 31.

Thus, as described above, the positioning unit 4 includes the first positioning member 5A and the second positioning member 5B which are driven to move or rotate with respect to the shuttle 3. Thus, when the shuttle 3 is located at the first position, the IC device 90 is placed on the placement surface 31 from the tray 200. A distance between the first positioning member 5A and the second positioning member 5B when the shuttle 3 is located at the first position is longer than a distance between the first positioning member 5A and the second positioning member 5B when the shuttle 3 is located at the second position.

Accordingly, the electronic component tester 1 having the above-described advantages of the electronic component handler 10 is obtained. Further, the IC device 90 can be transported to the testing unit 16, and thus, the IC device 90 can be tested by the testing unit 16. Further, the IC device 90 which has been tested can be transported from the testing unit 16.

In the present embodiment, the positioning unit 4 (the positioning unit 4A) is applied to the positioning of the IC device 90 in the device supplying unit 14. However, the present disclosure is not limited thereto. For example, the positioning unit 4 can be applied to the positioning of the IC device 90 in the device recovering unit 18.

Second Embodiment

The electronic component handler, the electronic component transport unit, and the electronic component tester according to a second embodiment of the present disclosure will be described with reference to FIGS. 6 to 8. However, a difference between the second embodiment and the above-described embodiment will be mainly described, and description of the same matters will be omitted.

The present embodiment is the same as the first embodiment except for the number of the positioning members.

Figure 6:
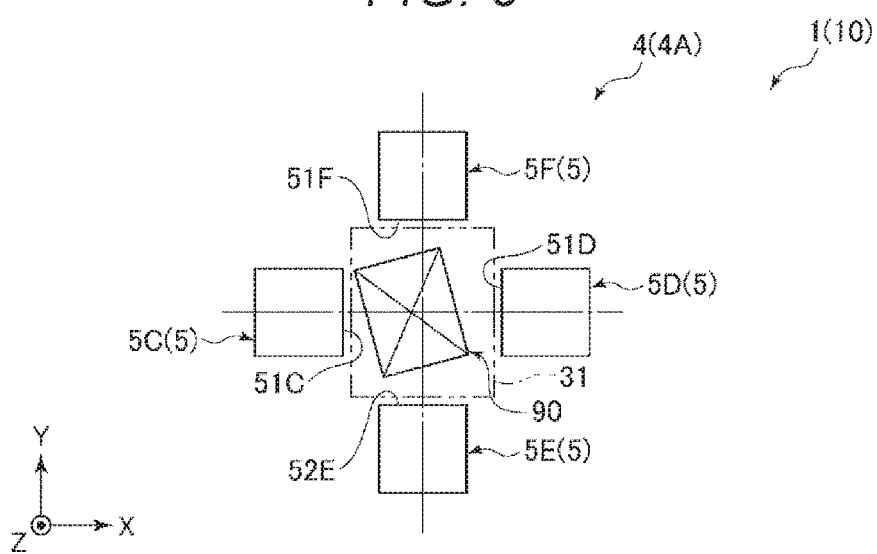
FIG. 6 is a plan view sequentially showing the operation state of the device supplying unit of the electronic component tester (a second embodiment) according to the present disclosure.
Figure 7:
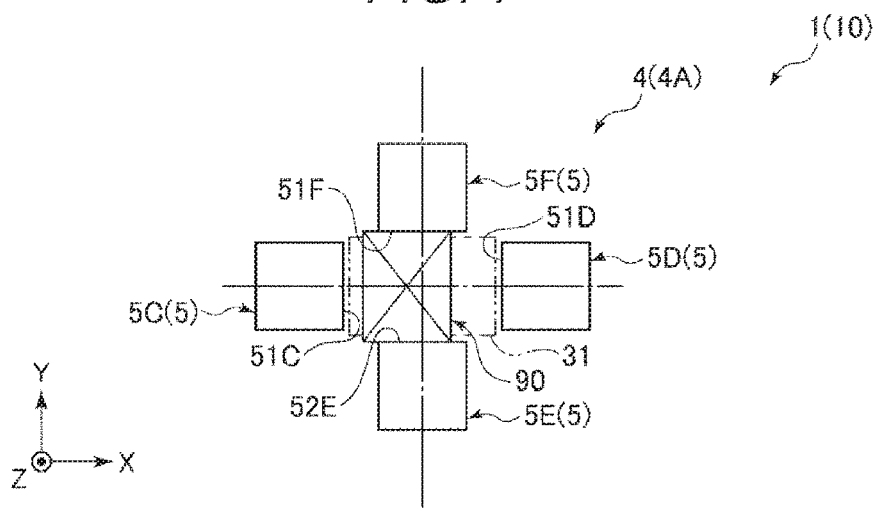
FIG. 7 is a plan view sequentially showing the operation state of the device supplying unit of the electronic component tester (the second embodiment) according to the present disclosure.
Figure 8:
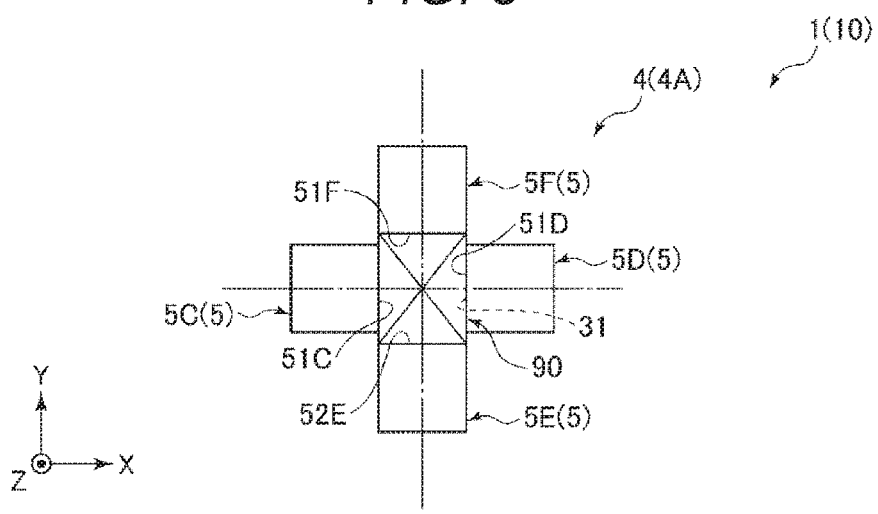
FIG. 8 is a plan view sequentially showing the operation state of the device supplying unit of the electronic component tester (the second embodiment) according to the present disclosure.

As shown in FIGS. 6 to 8, in the present embodiment, the positioning unit 4 has four positioning members 5 config-ured with square poles, particularly, rectangular parallelepipeds. These four positioning members 5 are arranged to surround the placement surface 31. The positioning member 5 located in the negative direction of the X axis of the placement surface 31 is referred to as a "first positioning member 5C", the positioning member 5 located in the positive direction of the X axis of the placement surface 31 is referred to as a "second positioning member 5D", the positioning member 5 located in the negative direction of the Y axis of the placement surface 31 is referred to as a "third positioning member 5E", and the positioning member 5 located in the positive direction of the Y axis of the placement surface 31 is referred to as a "fourth positioning member 5F".

The first positioning member 5C is supported to be movable along the X axis direction. The first positioning member 5C has a first surface 51C. The first surface 51C can approach the IC device 90 to come into contact with the IC device 90, in the negative direction of the X axis.

The second positioning member 5D is also supported to be movable along the X axis direction. The second positioning member 5D has a first surface 51D. The first surface 51D can approach the IC device 90 to come into contact with the IC device 90, in the positive direction of the X axis.

The third positioning member 5E is supported to be movable along the Y axis direction. The third positioning member 5E has a second surface 52E. The second surface 52E can approach the IC device 90 to come into contact with the IC device 90, in the negative direction of the Y axis.

The fourth positioning member 5F is also supported to be movable along the Y axis direction. The fourth positioning member 5F has a second surface 52F. The second surface 52F can approach the IC device 90 to come into contact with the IC device 90, in the positive direction of the Y axis.

With regard to a timing at which the first positioning member 5C, the second positioning member 5D, the third positioning member 5E, and the fourth positioning member 5F approach the IC device 90, as illustrated in FIGS. 7 and 8, the third positioning member 5E and the fourth positioning member 5F move in advance, and the first positioning member 5C and the second positioning member 5D move later. However, the present disclosure is not limited thereto. For example, the first positioning member 5C and the second positioning member 5D may move in advance, and the third positioning member 5E and the fourth positioning member 5F may move later.

Further, the first positioning member 5C, the second positioning member 5D, the third positioning member 5E, and the fourth positioning member 5F can be closer to each other in a positional relationship shown in FIGS. 7 and 8 than in a positional relationship shown in FIG. 6. Accordingly, the placement surface 31 can be narrowed before the IC device 90 is placed according to the size of the IC device 90. Further, when the IC device 90 is placed, if the IC device 90 rides on any one of the positioning members 5, the first positioning member 5C, the second positioning member 5D, the third positioning member 5E, and the fourth positioning member 5F may move to be spaced apart from each other. Accordingly, the IC device 90 slides down from the positioning member 5 on which the IC device 90 rides, and the entire IC device 90 is placed on the placement surface 31.

Further, although the positioning member 5 is configured with a square pole, the present disclosure is not limited thereto. For example, the positioning member 5 may be configured with a cylinder or a spherical body.

Third Embodiment

Hereinafter, the electronic component handler, the electronic component transport unit, and the electronic component tester according to a third embodiment of the present disclosure will be described with reference to FIGS. 9 and 10. However, a difference between the third embodiment and the above-described embodiment will be mainly described, and description of the same matters will be omitted.

The present embodiment is the same as the first embodiment except for movement of the positioning members.

Figure 9:
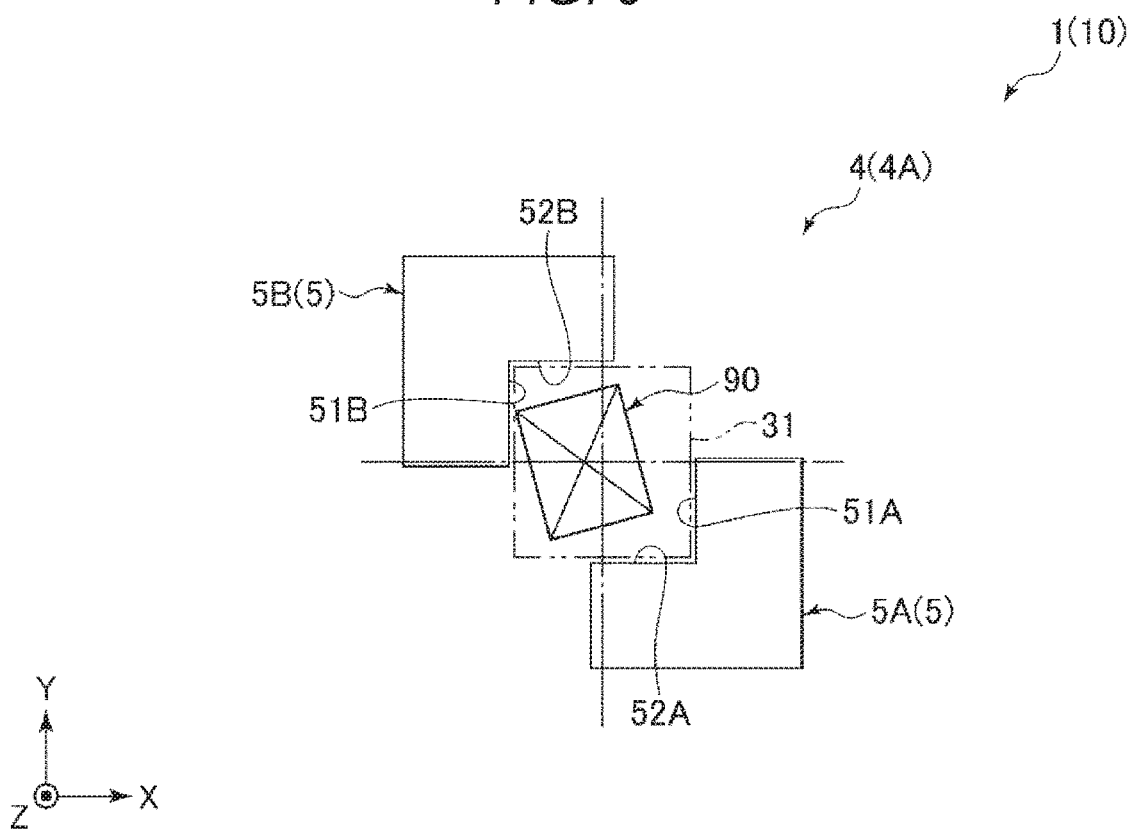
FIG. 9 is a plan view sequentially showing the operation state of the device supplying unit of the electronic component tester (a third embodiment) according to the present disclosure.
Figure 10:
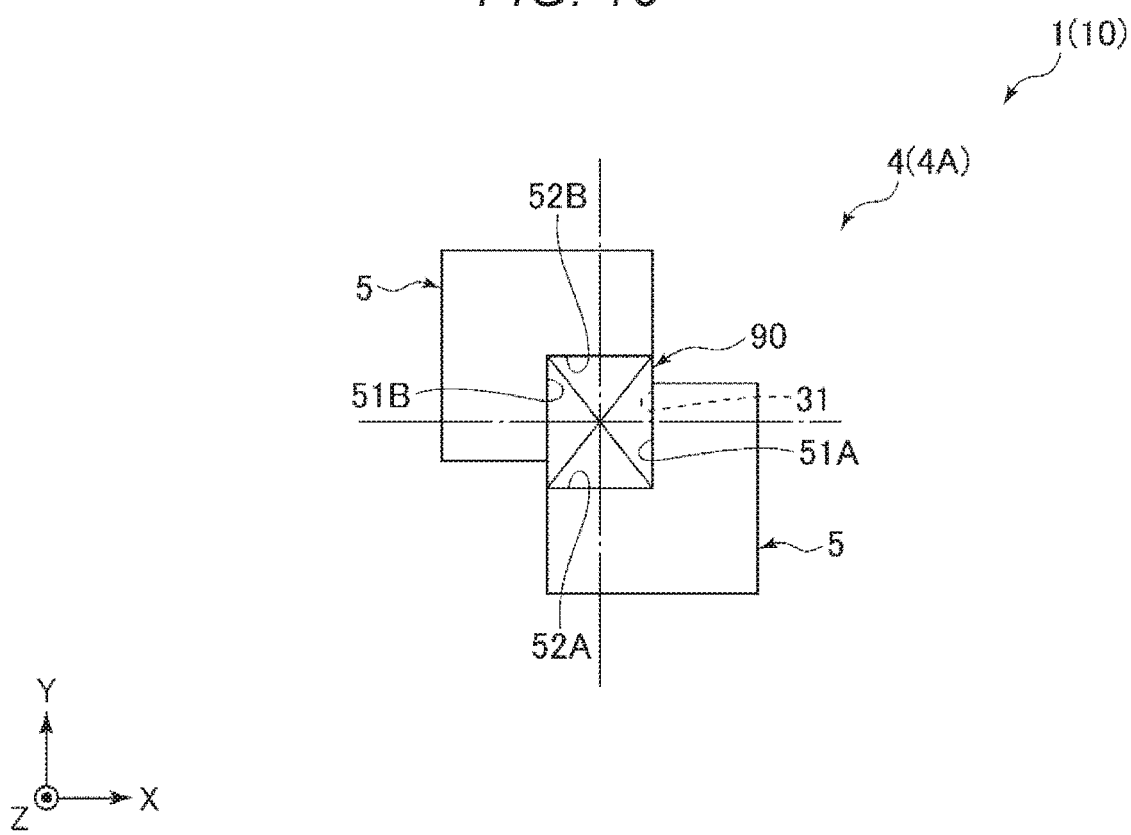
FIG. 10 is a plan view sequentially showing the operation state of the device supplying unit of the electronic component tester (the third embodiment) according to the present disclosure.

As illustrated in FIGS. 9 and 10, in the present embodiment, in the present embodiment, the first positioning member 5A and the second positioning member 5B are supported to be movable in a direction inclined in both the X axis direction and the Y axis direction, particularly, in a direction inclined by 45°, on the XY plane. Accordingly, as shown in FIG. 9, in a state in which the first positioning member 5A and the second positioning member 5B are spaced apart from each other, the IC device 90 is placed on the placement surface 31. Further, as shown in FIG. 10, in a state in which the first positioning member 5A and the second positioning member 5B approach each other, the IC device 90 can be positioned.

Timings at which the first positioning member 5A and the second positioning member 5B approach each other may be substantially the same or may be different from each other.

Fourth Embodiment

Hereinafter, the electronic component handler, the electronic component transport unit, and the electronic component tester according to a fourth embodiment of the present disclosure will be described with reference to FIGS. 11 and 12. However, a difference between the fourth embodiment and the above-described embodiment will be mainly described, and description of the same matters will be omitted.

The present embodiment is the same as the first embodiment except for the number of the positioning members.

Figure 11:
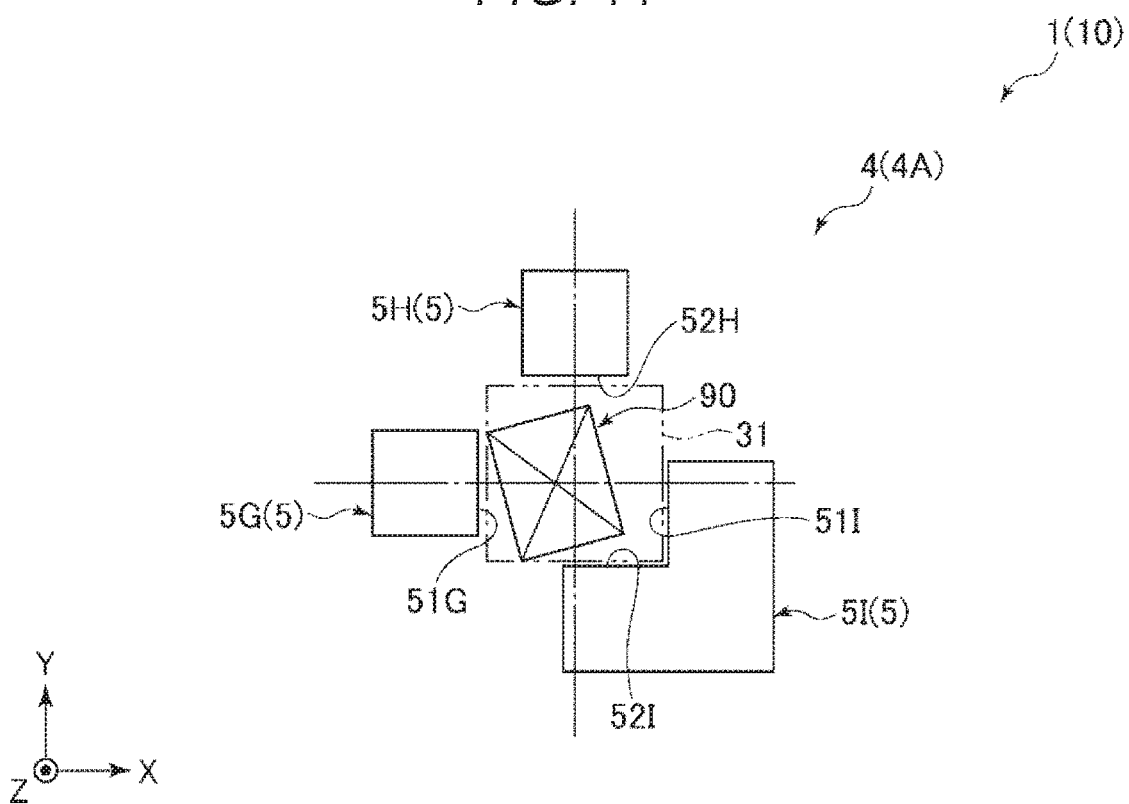
FIG. 11 is a plan view sequentially showing the operation state of the device supplying unit of the electronic component tester (a fourth embodiment) according to the present disclosure.
Figure 12:
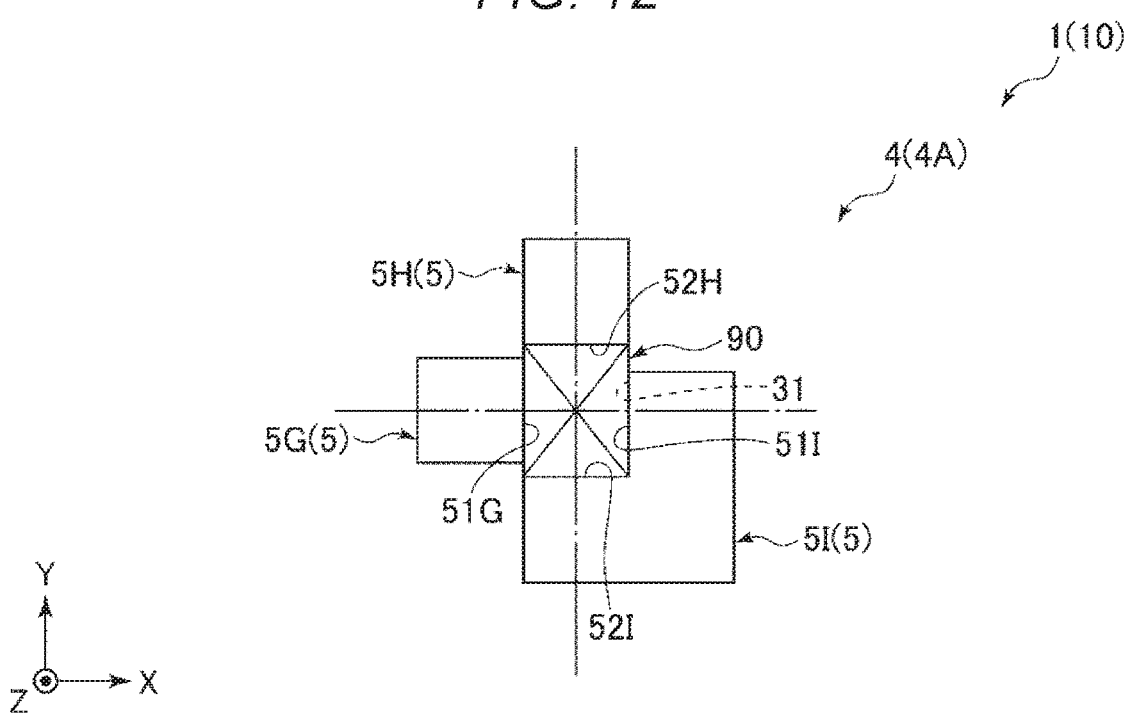
FIG. 12 is a plan view sequentially showing the operation state of the device supplying unit of the electronic component tester (the fourth embodiment) according to the present disclosure.

As shown in FIGS. 11 and 12, in the present embodiment, the positioning unit 4 has three positioning members 5. These three positioning members 5 are arranged to surround the placement surface 31. The positioning member 5 located in the negative direction of the X axis of the placement surface 31 is referred to as a "first positioning member 5G", the positioning member 5 located in the positive direction of the Y axis of the placement surface 31 is referred to as a "second positioning member 5H", and the remaining positioning member 5 is referred to as a "third positioning member 5I".

The first positioning member 5G is supported to be movable along the X axis direction. The first positioning member 5G has a first surface 51G. The first surface 51G can approach the IC device 90 to come into contact with the IC device 90, in the negative direction of the X axis.

The second positioning member 5H is supported to be movable along the Y axis direction. The second positioning member 5H has a second surface 52H. The second surface 52H can approach the IC device 90 to come into contact with the IC device 90, in the positive direction of the Y axis.

The third positioning member 5I is supported to be movable in a direction inclined in both the X axis direction and the Y axis direction, particularly, in a direction inclined by 45°. The third positioning member 5I has a first surface 51I and a second surface 52I. The first surface 51I can approach the IC device 90 to come into contact with the IC device 90, in the positive direction of the X axis. The second surface 52I can approach the IC device 90 to come into contact with the IC device 90, in the negative direction of the Y axis.

In the present embodiment, the positioning member 5 is supported to be movable. However, the present disclosure is not limited thereto. For example, the positioning member 5 may be rotatably supported.

Fifth Embodiment

Hereinafter, the electronic component handler, the electronic component transport unit, and the electronic component tester according to a fifth embodiment of the present disclosure will be described with reference to FIG. 13. However, a difference between the fifth embodiment and the above-described embodiment will be mainly described, and description of the same matters will be omitted.

The present embodiment is the same as the first embodiment except for a configuration of the electronic component tester.

Figure 13:
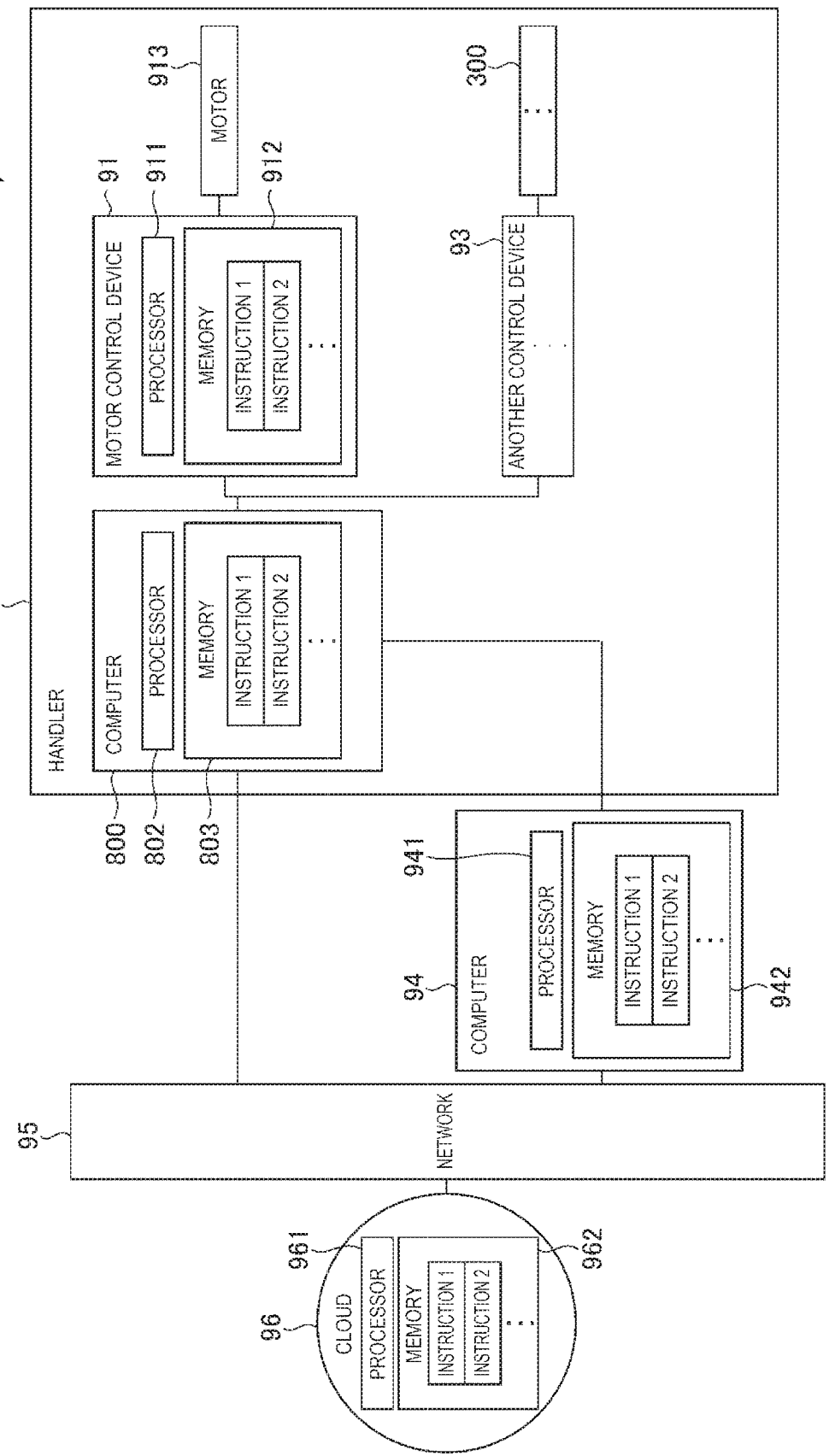
FIG. 13 is a block diagram showing the electronic component tester (a fifth embodiment) according to the present disclosure and a periphery thereof.

As shown in FIG. 13, in the present embodiment, the electronic component handler 10, which is a handler, has a motor control device 91 embedded therein and further has another control device 93 embedded therein in addition to a controller 800 configured with an industrial computer.

The controller 800 is connected to the motor control device 91 and the another control device 93. In the controller 800, the processor 802 can read an instruction from the memory 803 to execute control. Further, it is preferable that the controller 800 is connected to an I/F board (not shown) connected to the tester.

The motor control device 91 has a processor 911 and a memory 912, and the processor 911 can read an instruction from the memory 912 to execute control. Thus, the motor control device 91 can be connected to a motor 913 to control an operation of the motor 913. The motor 913 is a driving source which drives, for example, the tray transport mechanism 11A, the tray transport mechanism 11B, the device transport head 13, the device supplying unit 14, the tray transport mechanism 15, the device transport head 17, the device recovering unit 18, the device transport head 20, the tray transport mechanism 21, the tray transport mechanism 22A, and the tray transport mechanism 22B.

The processor 802 of the controller 800 can read an instruction from the memory 912 of the motor control device 91 to execute control.

Examples of the another control device 93 include, for example, a device that controls an operation of the monitor 300 or the like.

Further, the above-described control device may be separate from or integral with a control target member. For example, the motor control device 91 may be integral with the motor 913.

Further, the controller 800 is connected to a computer 94 outside the electronic component handler 10 that is a handler. The computer 94 has a processor 941 and a memory 942. Thus, the processor 802 of the controller 800 can read an instruction from the memory 942 to execute control.

Further, the computer 94 is connected to a cloud 96 through a network 95 such as a LAN. The cloud 96 has a processor 961 and a memory 962. Thus, the processor 802 of the controller 800 can read an instruction from the memory 962 to execute control.

The controller 800 may be directly connected to the network 95.

Sixth Embodiment

Hereinafter, the electronic component handler, the electronic component transport unit, and the electronic component tester according to a sixth embodiment of the present disclosure will be described with reference to FIG. 14. However, a difference between the sixth embodiment and the above-described embodiment will be mainly described, and description of the same matters will be omitted.

The present embodiment is the same as the fifth embodiment except for a configuration of the electronic component tester.

Figure 14:
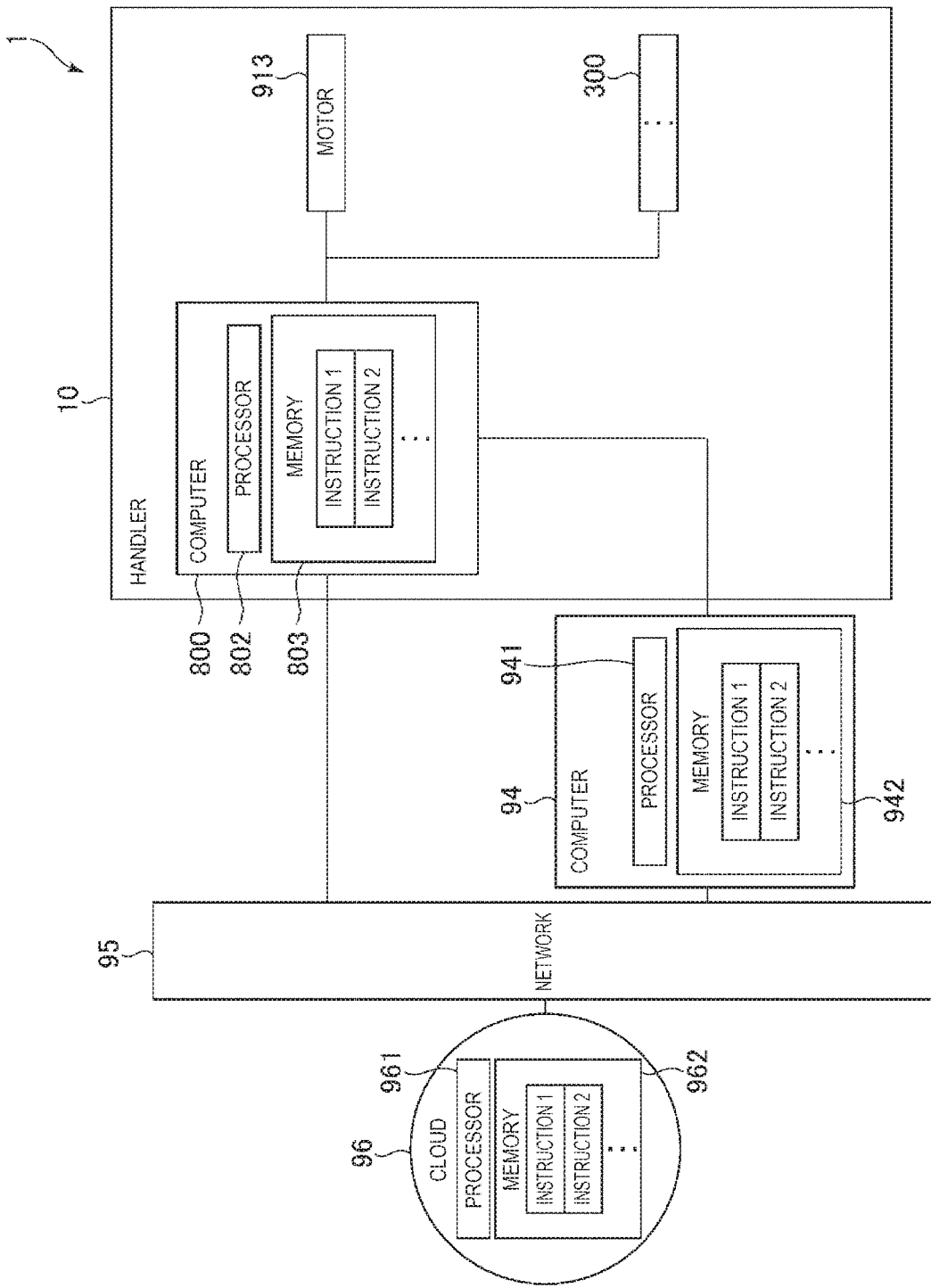
FIG. 14 is a block diagram showing the electronic component tester (a sixth embodiment) according to the present disclosure and a periphery thereof.

In the present embodiment shown in FIG. 14, the controller 800 is configured to have a control function of the motor control device 91 and a control function of the another control device 93. That is, the controller 800 has a configuration in which the motor control device 91 and the another control device 93 are embedded (integrated). Such a configuration contributes to miniaturization of the controller 800.

Hereinafter, although the electronic component handler, the electronic component transport unit, and the electronic component tester according to the present disclosure have been described with reference to the shown embodiment, the present disclosure is not limited thereto. Each unit constituting the electronic component handler, the electronic component transport unit, and the electronic component tester may be substituted by a predetermined configuration that can exhibit the same function. Further, a predetermined composition may be added.

Further, the electronic component handler, the electronic component transport unit, and the electronic component tester according to the present disclosure may be a combination of any two or more configurations (features) of the respective embodiments.

What is claimed is:

1. An electronic component handler for transporting an electronic component, the handler comprising:
   a shuttle having a placement surface on which the electronic component is placed and moving from a first position to a second position; and
   a positioning unit provided in the shuttle and positioning the electronic component at a predetermined position by coming into contact with the electronic component placed on the placement surface, wherein
   the positioning unit has a first positioning member and a second positioning member that are driven to move or rotate with respect to the shuttle, wherein
   the first positioning member and the second positioning member have a first surface coming into contact with the electronic component to position the electronic component in a first axis direction and a second surface coming into contact with the electronic component to position the electronic component in a second axis direction intersecting the first axis direction, respectively,
   when the shuttle is located at the first position, the electronic component is placed on the placement surface, and
   a distance between the first positioning member and the second positioning member when the shuttle is located at the first position is longer than a distance between the first positioning member and the second positioning member when the shuttle is located at the second position.

2. The electronic component handler according to claim 1, further comprising:
   a rotary shaft which is provided in the shuttle and about which the first positioning member and the second positioning member rotate; and
   a driving unit which is provided in the shuttle and rotates the first positioning member and the second positioning member about the rotary shaft.

3. The electronic component handler according to claim 2, wherein
   the driving unit has a first member, a second member, and a third member,
   the first member is provided with a connection unit connected to the first positioning member to rotate the first positioning member about the rotary shaft and receives a pressing force to move in a direction of the pressing force,
   the second member urges the first member in an opposite direction to the direction of the pressing force,
   the third member has one end connected to the first positioning member and the other end connected to the second positioning member and is elastically deformed,
   the first positioning member and the second positioning member are spaced apart from each other when the first member receives the pressing force against an urging force of the second member to move in the direction of the pressing force, and
   the first positioning member and the second positioning member approach each other when the pressing force is released and the first member moves in the opposite direction to the direction of the pressing force by the urging force of the second member.

4. The electronic component handler according to claim 3, wherein
   the third member is a coil spring which urges the two positioning members in a direction in which the two positioning members are spaced apart from each other.

5. An electronic component handler for transporting an electronic component, the handler comprising:
   a shuttle having a placement surface on which the electronic component is placed and moving from a first position to a second position;
   a positioning unit provided in the shuttle and positioning the electronic component at a predetermined position by coming into contact with the electronic component placed on the placement surface;
   a transport arm that transports and places the electronic component to and on the placement surface when the shuttle is located at the first position; and
   a processor, wherein
   the positioning unit has a first positioning member and a second positioning member that are driven to move or rotate with respect to the shuttle, wherein
   the first positioning member and the second positioning member have a first surface coming into contact with the electronic component to position the electronic component in a first axis direction and a second surface coming into contact with the electronic component to position the electronic component in a second axis direction intersecting the first axis direction, respectively,
   when the shuttle is located at the first position, the electronic component is placed on the placement surface,
   a distance between the first positioning member and the second positioning member when the shuttle is located at the first position is longer than a distance between the first positioning member and the second positioning member when the shuttle is located at the second position, and the processor performs
- a control to move the shuttle between the first position and the second position,
- a control to transport and place the electronic component to and on the placement surface by the transport arm, and
- a control to move the first positioning member and the second positioning member closer to or farther away from the electronic component.

6. An electronic component transport unit used when an electronic component is transported, the unit comprising:
- a shuttle plate having a placement surface on which the electronic component is placed and moving from a first position to a second position; and
- a positioning unit provided in the shuttle plate and positioning the electronic component at a predetermined position by coming into contact with the electronic component placed on the placement surface, wherein
- the positioning unit has a first positioning member and a second positioning member which are driven to move or rotate with respect to the shuttle plate, wherein
- the first positioning member and the second positioning member have a first surface coming into contact with the electronic component to position the electronic component in a first axis direction and a second surface coming into contact with the electronic component to position the electronic component in a second axis direction intersecting the first axis direction, respectively,
- when the shuttle plate is located at the first position, the electronic component is placed on the placement surface, and
- a distance between the first positioning member and the second positioning member when the shuttle plate is located at the first position is longer than a distance between the first positioning member and the second positioning member when the shuttle plate is located at the second position.

7. An electronic component tester for testing an electronic component, the tester comprising:
- a testing unit that tests electrical characteristics of the electronic component;
- a shuttle having a placement surface on which the electronic component is placed and moving from a first position to a second position; and
- a positioning unit provided in the shuttle and positioning the electronic component at a predetermined position by coming into contact with the electronic component placed on the placement surface, wherein
- the positioning unit has a first positioning member and a second positioning member which are driven to move or rotate with respect to the shuttle, wherein
- the first positioning member and the second positioning member have a first surface coming into contact with the electronic component to position the electronic component in a first axis direction and a second surface coming into contact with the electronic component to position the electronic component in a second axis direction intersecting the first axis direction, respectively,
- when the shuttle is located at the first position, the electronic component is placed on the placement surface, and
- a distance between the first positioning member and the second positioning member when the shuttle is located at the first position is longer than a distance between the first positioning member and the second positioning member when the shuttle is located at the second position.

8. The electronic component tester according to claim 7, further comprising:
- a rotary shaft which is provided in the shuttle and about which the first positioning member and the second positioning member rotate; and
- a driving unit provided in the shuttle and rotating the first positioning member and the second positioning member about the rotary shaft.

9. The electronic component tester according to claim 8, wherein
- the driving unit has a first member, a second member, and a third member,
- the first member is provided with a connection unit connected to the first positioning member to rotate the first positioning member about the rotary shaft and receives a pressing force to move in a direction of the pressing force,
- the second member urges the first member in an opposite direction to the direction of the pressing force,
- the third member has one end connected to the first positioning member and the other end connected to the second positioning member and is elastically deformed,
- the first positioning member and the second positioning member are spaced apart from each other when the first member receives the pressing force against an urging force of the second member to move in the direction of the pressing force, and
- the first positioning member and the second positioning member approach each other when the pressing force is released and the first member moves in the opposite direction to the direction of the pressing force by the urging force of the second member.

10. The electronic component tester according to claim 9, wherein
- the third member is a coil spring which urges the two positioning members in a direction in which the two positioning members are spaced apart from each other.

* * * * *